April 11, 1967 F. L. DE TURRIS ET AL 3,313,395

CLAMP ASSEMBLY

Filed May 27, 1965

United States Patent Office 3,313,395

Patented Apr. 11, 1967

3,313,395

CLAMP ASSEMBLY

Frank L. De Turris, Wappingers Falls, and Jean J. L. Godat, Poughkeepsie, N.Y., assignors to International Business Machines Corporation, Armonk, N.Y., a corporation of New York Filed May 27, 1965, Ser. No. 459,344
5 Claims. (Cl. 198—33)

This invention is directed generally to a clamp assembly for clamping an object in order to orient it to a specifically desired or reference position and, more particularly, to a clamp assembly for clamping a square substrate located on a conveyor belt for proper orientation with respect to a set reference position in order to permit a subsequent work operation to be precisely performed on a designated portion of the surface of the substrate.

In the microelectronic art of forming an electrical circuit on the surface of a substrate, it is essential that the substrate be oriented with respect to a reference position to permit accurate formation of portions of the circuit or to permit a work operation thereon. Individual substrates having electrical circuits are generally classified as integrated, monolithic, or hybrid circuit elements depending upon the final configuration of the substrate and the semiconductor devices located thereon. In the formation of any of these elements, it is necessary to properly position the substrate prior to a masking operation, diffusion operation, conductive land printing operation, or any of the other operations necessary to either form active or passive elements on the substrate. The active elements on the substrate are the semiconductor devices such as transistors, diodes, etc. whereas the passive elements are resistors, capacitors, etc. All of the above described work operations on a substrate require that the substrate be very accurately positioned prior to the performance of a work function thereon.

In a mechanized assembly line where millions of electrical circuits are individually formed on an equal number of substrates, it is imperative, in order to achieve repeated production of high quality circuits on the substrates, that the substrates be positioned accurately before each work operation. Since the circuit that is finally formed on an individual substrate is of such small dimensions that the spacing between the active and passive elements of the circuit are generally on the order of a few mils or less, it is essential that the substrate be positioned to an accuracy of plus or minus .00001 inch. In this manner, duplication of any desired circuit construction can be consistently achieved on each substrate so that the fabrication cost can be reduced to a minimum thereby enabling the use of the final product in large and complex electronic equipment such as computers.

A substrate positioning or orienting device, which is to be operatively mounted with respect to a substrate conveyor assembly, must function in such a manner that the positioning device is capable of swinging into contact with the substrate to properly orient the position thereof at the proper time interval, which is before the performance of a work function thereon. The substrate positioning device must also be capable of swinging away from the substrate to permit the substrate to be moved by the conveyor assembly onto the next work station. Furthermore, it is also essential that the substrate positioning device be capable of accurately positioning each substrate regardless of slight variations in the size or dimensions of the substrate. Accordingly, a substrate positioning device, for positioning or orienting substrates passing on a conveyor belt, must be dependable, well constructed for repeated operation, be easy to operate, permit fabrication thereof without the requirement of producing parts having small error tolerances, and have a substrate positioning accuracy such as to consistently align the center of each substrate to the imaginary center of the positioning device so that the work operation that is to be performed on the individual substrates can be consistently and accurately achieved.

Accordingly, it is an object of this invention, therefore, to provide an improved article positioning device.

It is another object of this invention to provide an article positioning device that is easy to operate and is capable of positioning articles to a very high degree of accuracy.

It is a further object of this invention to provide an article positioning device or clamping assembly that is capable of consistently positioning substrates having variations in size in order for a work operation to be carried out on a specific portion of the surface of the substrate.

It is still a further object of this invention to provide a substrate positioning device which is capable of accurately positioning substrates having parallel sided configurations such as squares and rectangles.

It is another object of this invention to provide a lever actuated, substrate positioning, clamping assembly which is capable of accurately positioning the center of a substrate to an imaginary center of the clamping assembly.

Briefly described, this invention relates to a clamp assembly especially adapted for orienting the position of a parallel sided article. The clamp assembly comprises a pair of lever arms adapted to swing into engagement with and out of engagement with diagonally opposite corners of the article. Means are associated with each of the lever arms for contacting the diagonally opposite corners of the article thereby orienting the center point of the diagonal line passing through the diagonally opposite corners of the article with the center point between the article contacting means of each of the lever arms. The article contacting means are preferably discs which make line contact with each side forming the diagonally opposite corners of the article. Means are operatively connected to the pair of lever arms for simultaneously swinging each of tthe lever arms an equal distance into and out of engagement with the diagonally opposite corners of the article.

The foregoing and other objects, features and advantages of the invention will be apparent from the following more particular description of preferred embodiments of the invention, as illustrated in the accompanying drawings.

CLAMP ASSEMBLY

Figures 1, 2, 3:
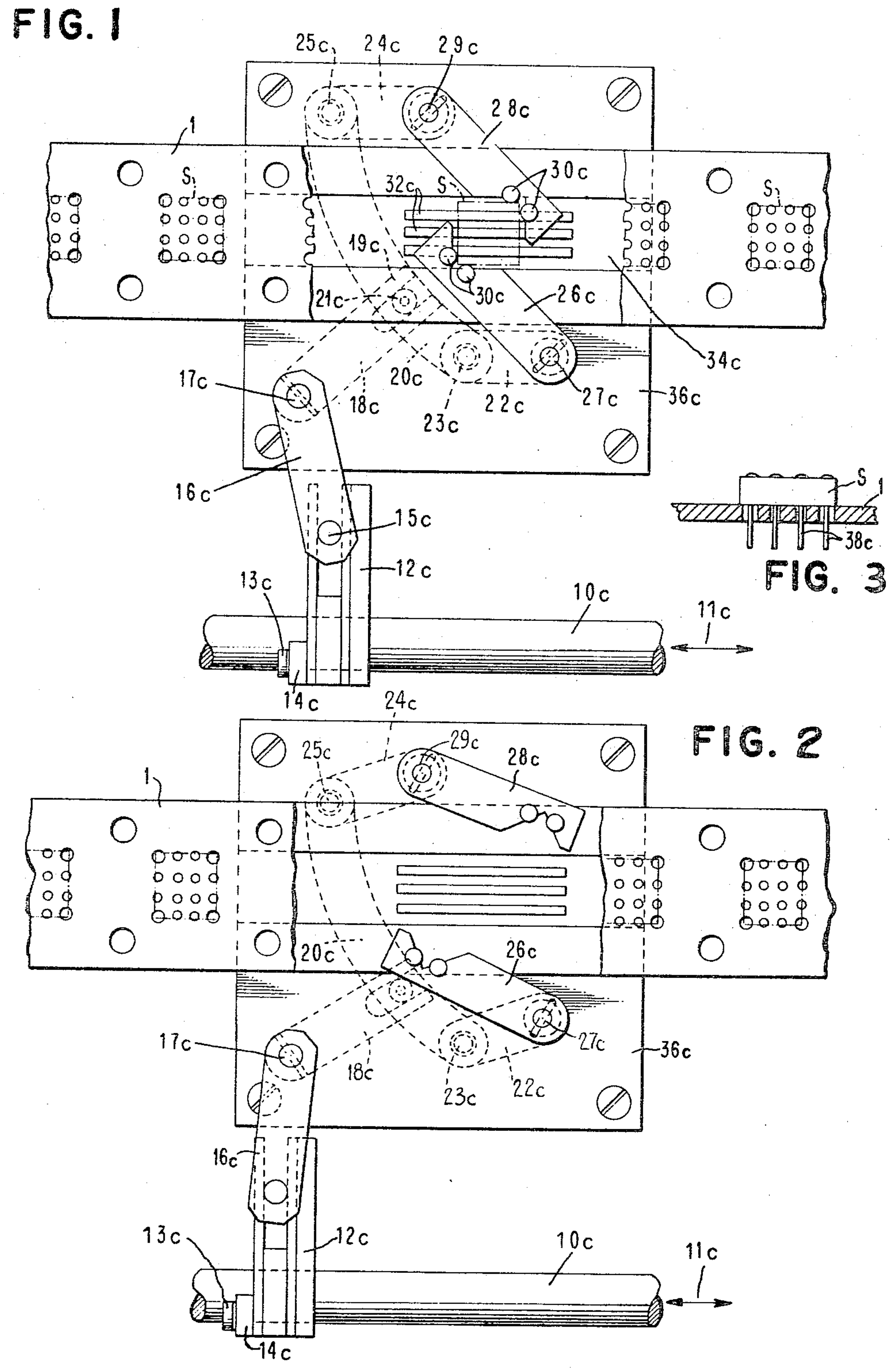
FIG. 1 is a top view of a clamping assembly in a closed position for orienting a substrate into a reference position.
FIG. 2 is a top view of the clamping assembly of FIG. 1 with the clamping assembly in an open position.
FIG. 3 is a partial sectional view of a substrate and perforated conveyor belt showing the location of the substrate pins through the perforations of the belt.

FIGS. 1 and 2 show closed and open positions, respectively, of a clamp assembly which serves to reorient the position of each substrate S to the desired reference position prior to the performance of a work function thereon so that each substrate will have work done on it exactly in the position desired. Referring to FIGS. 1 and 2, a bar or shaft 10c is caused to reciprocate in the direction shown by arrows 11c by any suitable power source such as by cam or pneumatic means (not shown). Attached to the bar 10c is a slotted member 12c which is preferably composed of three separate members, the outer two of which are of spring steel and longer than the intermediate center member to form the slot shown. Adjustment means in the form of a threaded screw 13c and nut 14c serve to vary the width of the slot by the cooperative engagement of the screw 13c with lined-up threaded apertures in the separate members of the slotted member 12c. Accordingly, a pin 15c is inserted in the slot of the slotted member 12c and held by the slotted member 12c for movement therewith. Pin 15c is attached to a movable lever arm 16c having an integral or connected extending lever arm portion 18c. The lever arm 16c pivots into the closed position shown in FIG. 1, when the bar 10c is moved to the right. Since pivot 17c is fixed, lever arm portion 18c swings to the position shown in FIG. 1 causing link arm 20c to shift counterclockwise with respect to pivot 17c. Link arm 20c is connected to lever arm portion 18c by the engagement between bifurcated portion 19c located at one end of lever arm portion 18c and pin 21c connected to link arm 20c. Lever arms 22c and 24c are pivotally connected to opposite ends of link arm 20c by means of movable, tapered, zero backlash pivots 23c and 25c. Lever arms 22c and 24c are respectively connected by means of fixed, tapered, zero backlash pivots 27c and 29c to lever arm portions 26c and 28c positioned above tape 1. Accordingly, lever arms 22c and 26c and lever arms 24c and 28c swing about the fixed pivots 27c and 29c respectively during the actuation of the clamp assembly. Lever arm portions 26c and 28c each contain right angle cut-out portions with a pair of work contact discs 30c of wear resistant material, such as tungsten carbide located in each cut-out portion.

Accordingly, in FIG. 1 the lever arm 22c with the lever arm portion 26c and the lever arm 24c with the lever arm portion 28c are shown in closed position whereby the tungsten carbide discs 30c of each set of lever arms contact opposite corners of the substrate and thereby precisely adjust or set the substrate in a fixed position on the belt 1. It is advantageous to permit pins 38c of the substrate S (FIG. 3) to be displaced freely in the holes in the belt which preferably have a larger diameter than the pins. In the position shown in FIG. 1, the substrate has its pins extending through the apertures in the belt and through slots 32c formed upward from depressed area 34c located in support member 36c. The depressed area 34c consists of a piece of metal which is located below the 6 mil thick stainless steel belt so that the clamping action and positioning of the substrate can be achieved without possible damage to the belt. Fixed pivots 17c, 27c, and 29c are attached to support member 36c.

In the open position as shown in FIG. 2, the bar 10c is moved to the left and the lever arm 16c moves accordingly, causing the extended lever arm portion 18c to move clockwise with respect to pivot 17c towards the bar 10c. Link arm 20c also moves clockwise with lever arm portion 18c, causing movable pivots 23c and 25c to swing into the position shown and thereby force lever arm portions 26c and 28c to swing away from the substrate. Accordingly, in this position the clamping assembly is open and the substrate is permitted to move with the belt.

The geometrical characteristics of this type of clamp provide centering to the imaginary center of the clamp rather than to the center of the object being clamped. With this type of centering action, precise centering and squaring of a square object is achieved with errors in centering held to ±.000012 inch. In achieving this high degree of accuracy, the portion of link arm 20c extending between pins 23c and 25c is equal to the distance between pins 27c and 29c. Similarly, lever arm 22c is the same as lever arm 24c and lever arm 26c is the same as lever arm 28c.

The spring action of the left handed portion of the slotted member 12c allows for variation in the size of the article being clamped and, in addition, provides an over ride spring effect in the clamping action.

In order to achieve the high degree of accuracy that is required to position the substrate S on the belt 1 (FIG. 3) it is essential that the center of the fixed pivot pin 27c and 29c of each of the lever arms 26c and 28c be on a line with the substrate contact portions of the pair of discs 30c of each lever arm 26c and 28c which line must be substantially normal to the diagonal line through the contacted corners of the square substrate S. Hence, variations in the size of the substrate and even rectangular substrates can be accurately positioned provided that the above requirement is met.

Furthermore, in order to achieve consistently positive orientation of the center of the substrate S to the imaginary center of the clamping assembly it is preferred that the discs 30c be located close to the apex of the right angle cut-out portions in the lever arms 26c and 28c. Preferably, the line of contact that each disc 30c makes with the substrate S is less than a third of the distance between the clamped substrate corner and the center of the contacted side of the substrate.

FIG. 3 illustrates the space between pins 38c of the substrate S and the perforations in the belt 1. Accordingly, the substrate S is permitted freedom of motion in the belt 1 and the clamping assembly accurately positions the substrate S within the limits permitted by the perforations in the belt 1.

The clamp assembly of this invention is particularly useful in the mechanized system described in the patent application, Serial No. 459,179, entitled "Chip Positioning Machine" assigned to the same assignee of this invention and filed concurrently herewith.

The foregoing and other objects, features and advantages of the invention will be apparent from the following more particular description of preferred embodiments of the invention, as illustrated in the accompanying drawings.

We claim:

1. A clamp assembly especially adapted for orienting the position of a square article comprising, in combination, a pair of lever arms adapted to swing into engagement with and out of engagement with two diagonally opposite corners of said article, contact means associated with each of said lever arms for making line contact with each side forming each of said two diagonally opposite corners of said article, each of said pair of lever arms having a fixed pivot pin centrally located at one end of said lever arm, the center of said fixed pivot pin of each of said lever arms being on a line with the article contact portions of said contact means which line is normal to the diagonal line through said two diagonally opposite corners of said article, and means operatively connected to said fixed pivot pins for simultaneously turning said pivot pins in clockwise and counter-clockwise directions thereby swinging said lever arms into and out of engagement with said two diagonally opposite corners of said article.

2. A clamp assembly especially adapted for orienting the position of a square substrate comprising, in combination, a first lever arm adapted to swing into engagement with and out of engagement with one corner of said square substrate; a second lever arm adapted to swing into engagement with and out of engagement with the diagonally opposite corner of said square substrate, said first and second lever arms being substantially identical and each having a right angle cut-out portion adjacent to one end thereof for receiving the respective corners of said square substrate, said substrate being located in the same plane as said first and second lever arms; a pair of discs of wear resistant material located adjacent the apex of each of said right angle cut-out portions of said first and second lever arms, each of said discs being located less than a third of the distance to the center of the contacted side of said square substrate and being adapted to provide line contacts with said diagonally opposite corners of said substrate, a fixed pivot pin centrally located adjacent the other end of each of said lever arms, the center of said fixed pivot pin of each of said lever arms being on a line with the substrate contact portions of said discs which line is normal to the diagonal line through the respective corners of said square substrate, third and fourth lever arms respectively operatively connected at one end portion to said first and second lever arms by attachment to said fixed pivot pins, said third and fourth lever arms being substantially identical and located in a plane parallel to the plane containing said first and second lever arms, a link arm connected to a movable pivot pin at each of the other end portions of said third and fourth lever arms, said link arm being adapted to swing said third and fourth lever arms from one position to another position thereby simultaneously swinging said first and second lever arms from an open clamping position to a closed clamping position about said substrate, the distance between said movable pivot pins at each end of said link arm being substantially equal to the distance between said fixed pivot pins located at the other end of each of said first and second lever arms, fifth and sixth lever arms each respectively connected at one end portion to a fixed pivot pin member, said fifth and sixth lever arms operatively connected together to swing about said fixed pivot pin member, said fifth lever arm being operatively connected at the other end portion thereof to said link arm and adapted to swing said link arm in clockwise and counterclockwise directions, and means operatively connected to the other end portion of said sixth lever arm and adapted to swing said sixth and fifth lever arms about said fixed pivot pin member.

3. A clamp assembly especially adapted for orienting the position of a square article comprising, in combination, a pair of lever arms adapted to swing into engagement with and out of engagement with two diagonally opposite corners of said article, means associated with each of said lever arms for contacting said two diagonally opposite corners of said article thereby orienting the center point of the diagonal line passing through said two diagonally opposite corners of said article with the center point between said article contacting means of each of said lever arms when said pair of lever arms are in engagement with said article, and means operatively connected to said pair of lever arms for simultaneously swinging on an arc each of said lever arms an equal distance into and out of engagement with said two diagonally opposite corners of said article.

4. A clamp assembly especially adapted for orienting the position of a square article comprising, in combination, first and second lever arms adapted to swing into engagement with and out of engagement with two diagonally opposite corners of said article, each of said first and second lever arms having a free swinging end and a fixed end, contact means associated with each of said first and second lever arms for making line contact with each side forming said two diagonally opposite corners of said article, and means operatively connected to said first and second lever arms for simultaneously swinging on an arc each of said first and second lever arms an equal distance into and out of engagement with said two diagonally opposite corners of said article, said means operatively connected to said first and second lever arms comprising a fixed pivot pin centrally located adjacent the fixed end of each of said lever arms, third and fourth lever arms respectively operatively connected at one end portion to said first and second lever arms by attachment to said fixed pivot pins, said third and fourth lever arms being substantially identical, a link arm connected to a movable pivot pin at each of the other end portions of said third and fourth lever arms, said link arm being adapted to swing said third and fourth lever arms from one position to another position thereby simultaneously swinging said first and second lever arms from an open clamping position to a closed clamping position about said article.

5. A clamp assembly especially adapted for orienting the position of a square article comprising, in combination, first and second lever arms adapted to swing into engagement with and out of engagement with two diagonally opposite corners of said article, each of said first and second lever arms having a free swinging end and a fixed end, disc means associated with each of said first and second lever arms for making line contact with each side forming said two diagonally opposite corners of said article, said disc means contacting said article at positions closer to said two diagonally opposite corners of said article than to the center point of the contacted sides of said article, and means operatively connected to said first and second lever arms for simultaneously swinging on an arc each of said first and second lever arms an equal distance into and out of engagement with said two diagonally opposite corners of said article, said means operatively connected to said first and second lever arms comprising a fixed pivot pin centrally located adjacent the fixed end of each of said lever arms, third and fourth lever arms respectively operatively connected at one end portion to said first and second lever arms by attachment to said fixed pivot pins, said third and fourth lever arms being substantially identical, a link arm connected to a movable pivot pin at each of the other end portions of said third and fourth lever arms, said link arm being adapted to swing said third and fourth lever arms from one position to another position thereby simultaneously swinging said first and second lever arms from an open clamping position to a closed clamping position about said article.

References Cited by the Examiner

UNITED STATES PATENTS

| | | | |
|---|---|---|---|
| 2,683,521 | 7/1954 | Reynolds ____________ | 198—33 |
| 2,723,743 | 11/1955 | Carter ______________ | 198—33 |

EVON C. BLUNK, *Primary Examiner.*

SAMUEL F. COLEMAN, *Examiner.*

A. C. HODGSON, *Assistant Examiner.*